US008749269B2

(12) United States Patent
Cao

(10) Patent No.: US 8,749,269 B2
(45) Date of Patent: Jun. 10, 2014

(54) CML TO CMOS CONVERSION CIRCUIT

(71) Applicant: Yongfeng Cao, Shanghai (CN)

(72) Inventor: Yongfeng Cao, Shanghai (CN)

(73) Assignee: Shanghai Huali Microelectronics Corporation, Shanghai (CN)

(*) Notice: Subject to any disclaimer, the term of this patent is extended or adjusted under 35 U.S.C. 154(b) by 56 days.

(21) Appl. No.: 13/656,700

(22) Filed: Oct. 20, 2012

(65) Prior Publication Data
US 2013/0099822 A1    Apr. 25, 2013

(30) Foreign Application Priority Data
Oct. 21, 2011    (CN) .......................... 2011 1 0322330

(51) Int. Cl.
H03K 19/0185    (2006.01)

(52) U.S. Cl.
CPC .............................. *H03K 19/018528* (2013.01)
USPC ................................ 326/68; 326/27; 326/81

(58) Field of Classification Search
CPC .............. H03K 19/018521; H03K 19/018528; H03K 19/018524
USPC .......... 326/21, 26, 27, 62, 63, 80, 81, 83, 115
See application file for complete search history.

(56) References Cited

U.S. PATENT DOCUMENTS

| 6,169,434 | B1 * | 1/2001 | Portmann ..................... 327/175 |
| 6,717,474 | B2 * | 4/2004 | Chen et al. .................... 330/301 |
| 6,806,744 | B1 * | 10/2004 | Bell et al. ....................... 327/70 |
| 7,667,916 | B1 * | 2/2010 | Aram ............................... 360/67 |
| 7,929,241 | B1 * | 4/2011 | Aram ............................... 360/67 |
| 2004/0178828 | A1 * | 9/2004 | Viehmann et al. ............ 326/115 |

* cited by examiner

Primary Examiner — Don Le
(74) Attorney, Agent, or Firm — Anova Law Group, PLLC

(57) ABSTRACT

The present invention provides a CML to CMOS conversion circuit comprising a first differential unit, a second differential unit, and an output unit. The output unit comprises a series connection of a first inverter and a second inverter, wherein, a resistor is connected with the first inverter in parallel. The CML to CMOS conversion circuit of the present invention omits the amplifier in the conventional circuit and reduces the delay time to 34 ps, which is almost half of the delay time of 64 ps in the conventional circuit, and thus provides more clock delay redundancy for the high speed parallel-serial conversion circuit.

3 Claims, 3 Drawing Sheets

US 8,749,269 B2

CML TO CMOS CONVERSION CIRCUIT

CROSS-REFERENCE TO RELATED APPLICATION

This application claims the priority benefit of China application serial no. 201110322330.9, filed Oct. 21, 2011. All disclosure of the China application is incorporated herein by reference.

FIELD OF THE INVENTION

The present invention relates to the field of semiconductor circuit design, and more particularly to a high speed current mode logic (CML) to complementary metal oxide semiconductor (CMOS) clock signal conversion circuit.

BACKGROUND OF THE INVENTION

The level standards which are commonly used currently comprise TTL, CMOS, LVTTL, LVCMOS, ECL, or the like. Besides, the level standards like LVDS, GTL, PGTL, CML, HSTL, which have a relatively high speed of data transmission, are also in use. CML level is the most simple among all the high speed data interfaces. In the CML level, the input and output are matched with each other, thus reducing peripheral devices and making it suitable for operating at higher frequency bands. The CML interface typically has an output circuit including a differential pair. The resistance value of the collector of the differential pair is 50Ω. The switch between the high and low level of the output signal is realized by the switching control of the differential pair which has a common emitter. The constant current source from the emitter of the differential pair to the ground typically has a value of 16 mA. Provided that the output load of CML is a pull-up resistor of 50Ω, the single-ended CML output signal has a swing of $V_{CC} \sim V_{CC} - 0.4$ V. In this case, the differential output signal has such a small swing of 800 mV that the power consumption is very low. The CML interface level has a power consumption lower than ½ of ECL, while it has a differential signal interface with similar characteristics with ECL and LVDS.

In a high speed parallel-serial conversion circuit, the clock input over 3 GHz is always performed in a CML mode, while the parallel-serial conversion circuit at a lower frequency is realized by digital circuits. Thus there is a need for a circuit for converting CML into CMOS. In the whole process of high speed parallel-serial conversion, it is generally required that the delay of clock should not exceed a clock cycle. Therefore, it is required that the delay in the CML-CMOS circuit should be as short as possible. A conventional circuit is shown in FIG. 1. In the paper of Tondo, D. F. and Lopez, R. R. from Argentina, "A low-power, high-speed CMOS/CML 16:1 serializer", Micro-Nanoelectronics, Technology and Applications, 2009. EAMTA 2009 1-2 Oct. 2009, page(s): 81-86, a CML-CMOS clock signal conversion circuit configuration is proposed which is now most widely used. The CML to CMOS conversion circuit comprises a first differential unit including a first differential transistor M1 and a second differential transistor M2; a second differential unit including a third differential transistor M3 and a fourth differential transistor M4; an amplifier including transistors M5 and M6; and an output unit comprising a series connection of a first inverter and a second inverter. The specific signal conversion circuit diagrams for a 65 nm and 45 nm process are shown in FIG. 2a, FIG. 2b, respectively.

SUMMARY OF THE INVENTION

Accordingly, at least one objective of the present invention is to provide a high speed current mode logic (CML) to complementary metal oxide semiconductor (CMOS) clock signal conversion circuit, which reduces the delay of the conventional circuit configuration and maintains the functional effectiveness of the conventional circuit configuration.

To achieve these and other advantages and in accordance with the objective of the invention, as embodied and broadly described herein, the invention provides a CML to CMOS conversion circuit, comprising:

a first differential unit, a second differential unit, and an output unit, the first differential unit comprises a first differential transistor M1 and a second differential transistor M2, the second differential unit comprises a third differential transistor M3 and a fourth differential transistor M4, the output unit comprises a series connection of a first inverter and a second inverter, the gate of the first differential transistor M1 and the gate of the second differential transistor M2 receive an input voltage, the source or drain of the first differential transistor M1 is connected with the source or drain of the second differential transistor M2, the drain or source of the first differential transistor M1 is connected with the drain or source of the third differential transistor M3, the drain or source of the second differential transistor M2 is connected with the drain or source of the fourth differential transistor M4, the gate of the third differential transistor M3 is connected with the gate of the fourth differential transistor M4, the gate of the third differential transistor is connected with its drain or source, the input terminal of the first inverter is connected with the drain or source of the second differential transistor M2, the source or drain of the third differential transistor M3 and the source or drain of the fourth differential transistor M4 are connected with a supply voltage, wherein, a resistor is connected with the first inverter in parallel.

In one embodiment of the present invention, the first differential transistor M1 and the second differential transistor M2 are NMOS transistors; the third differential transistor M3 and the fourth differential transistor M4 are PMOS transistors.

In one embodiment of the present invention, the value of the resistor is in a range from 10 KΩ~1MΩ.

Compared with the conventional technology, the CML to CMOS conversion circuit of the present invention omits the amplifier in the conventional circuit and reduces the delay time to 34 ps, which is almost half of the delay time of 64 ps in the conventional circuit, and thus provides more clock delay redundancy for the high speed parallel-serial conversion circuit.

BRIEF DESCRIPTION OF THE DRAWINGS

The CML to CMOS conversion circuit of the present invention will be elucidated by reference to the following embodiments and the accompanying drawings, in which.

DETAILED DESCRIPTION OF THE EMBODIMENTS

The CML to CMOS conversion circuit of the present invention will be described in further details hereinafter with respect to the embodiments and the accompanying drawings.

Figure 1:
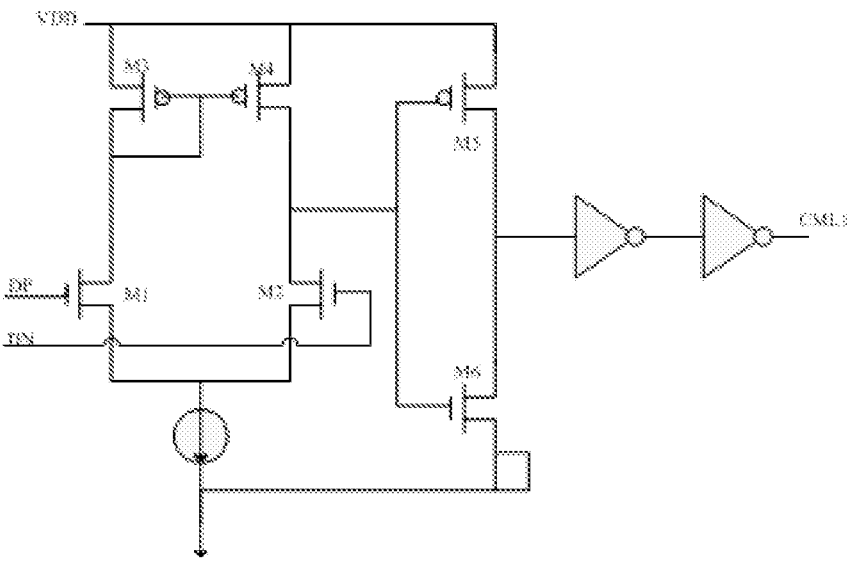
FIG. 1 is a diagram showing the conventional CML to CMOS high speed parallel-serial conversion circuit.
Figure 2A:
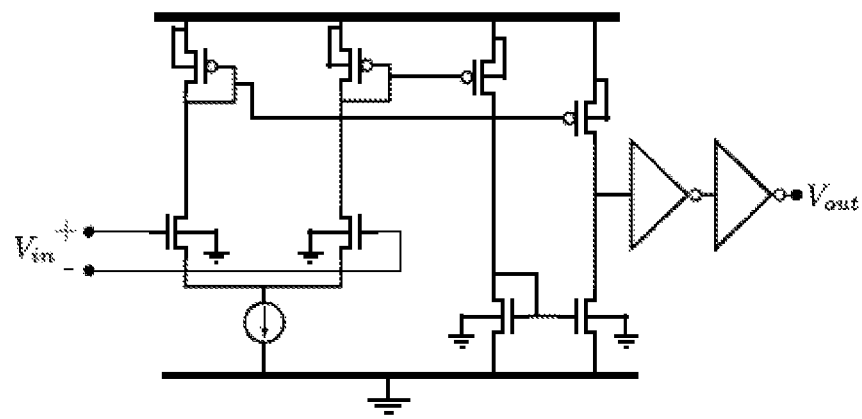
FIGS. 2a, 2b are diagrams showing the conventional CML to CMOS high speed parallel-serial conversion circuit for 65 nm and 45 nm process respectively.
Figure 2B:
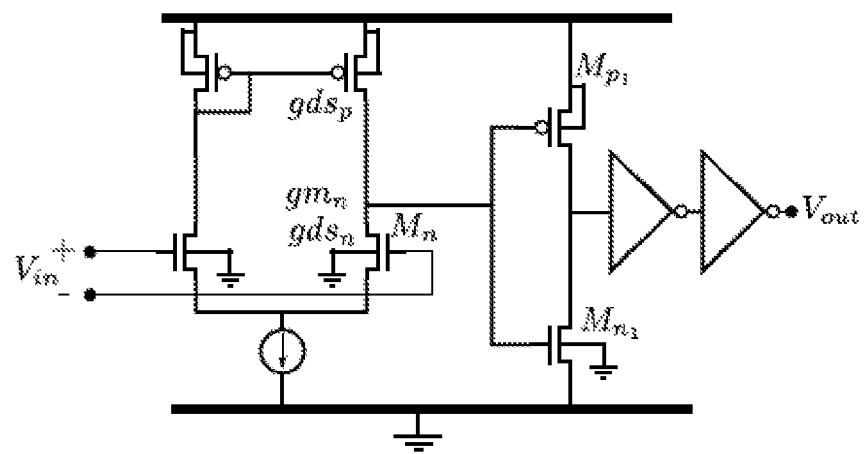
Figure 3:
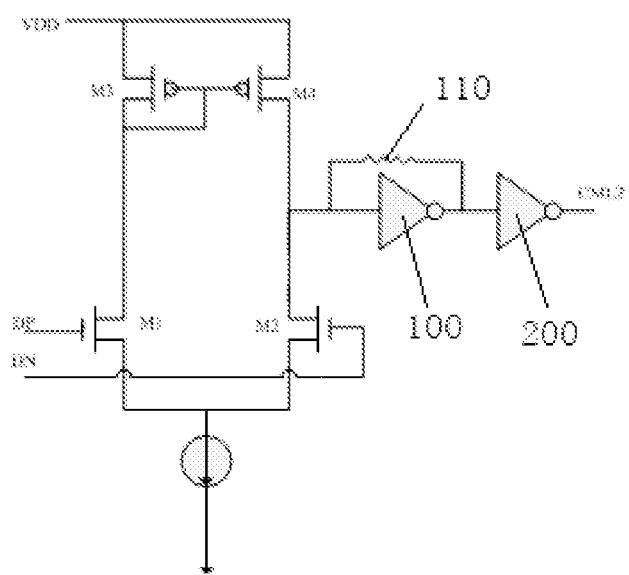
FIG. 3 is a diagram showing the CML to CMOS high speed parallel-serial conversion circuit of the present invention.

As shown in FIG. 3, the high speed current mode logic (CML) to complementary metal oxide semiconductor (CMOS) conversion circuit of the present invention comprises: a first differential unit, a second differential unit, and an output unit. The first differential unit comprises a first differential transistor M1 and a second differential transistor M2. The second differential unit comprises a third differential transistor M3 and a fourth differential transistor M4. The output unit comprises a series connection of a first inverter 100 and a second inverter 200. The gate of the first differential transistor M1 receives an input voltage DP and the gate of the second differential transistor M2 receives an input voltage DN. The source or drain of first differential transistor M1 is connected with the source or drain of the second differential transistor M2. The drain or source of the first differential transistor M1 is connected with the drain or source of the third differential transistor M3. The drain or source of the second differential transistor M2 is connected with the drain or source of the fourth differential transistor M4. The gate of the third differential transistor M3 is connected with the gate of the fourth differential transistor M4. The gate of the third differential transistor is connected with its drain or source. The input terminal of the first inverter is connected with the drain or source of the second differential transistor M2. The source or drain of the third differential transistor M3 and the source or drain of the fourth differential transistor M4 are connected with a supply voltage VDD. Herein, a resistor 110 is connected with the first inverter 100 in parallel. That is, the input terminal of the first inverter 100 is connected with its output terminal through the resistor 110. The value of the resistor 100 can be in a range from 10 KΩ~1 MΩ. In this manner, the resistor 110 is connected between the input and output terminal of the first inverter 100. As a result, the amplifier used in the conventional conversion circuit as shown in FIG. 1 is omitted, and the bandwidth of the first inverter 100 which acts as an amplifier is expanded due to the resistor 110, and thus the delay time in conversion from CML to CMOS signal is reduced. Wherein, the first differential transistor M1 and the second differential transistor M2 are NMOS transistors; the third differential transistor M3 and the fourth differential transistor M4 are PMOS transistors.

Figure 4:
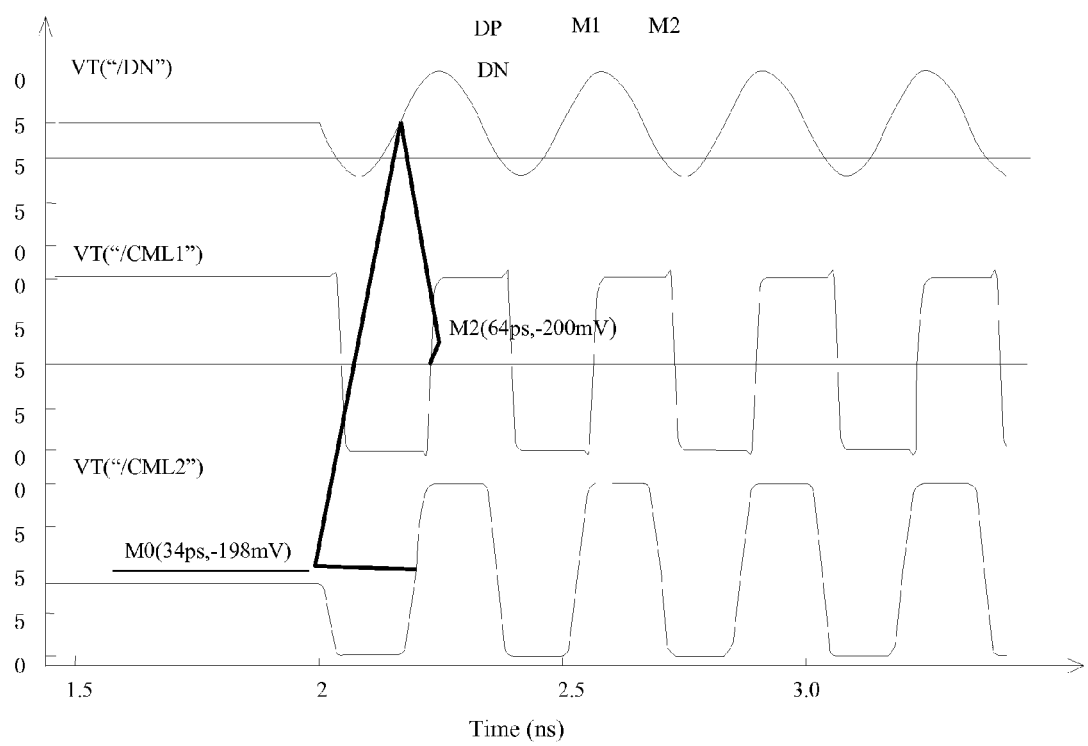
FIG. 4 is a simulated output waveform diagram of the CML to CMOS high speed parallel-serial conversion circuit of the present invention.

Further, by comparing the simulated output waveform diagrams of the conventional conversion circuit and that of the modified conversion circuit of the present invention in FIG. 4, it can be seen that the present invention reduces the delay time to 34 ps, which is almost half of the delay time of 64 ps in the conventional circuit, and thus provides more clock delay redundancy for the high speed parallel-serial conversion circuit.

In summary, the CML to CMOS conversion circuit of the present invention omits the amplifier in the conventional circuit and reduces the delay time to 34 ps, which is almost half of the delay time of 64 ps in the conventional circuit, and thus provides more clock delay redundancy for the high speed parallel-serial conversion circuit.

Although the present invention has been disclosed as above with respect to the preferred embodiments, they should not be construed as limitations to the present invention. Various modifications and variations can be made by the ordinary skilled in the art without departing the spirit and scope of the present invention. Therefore, the protection scope of the present invention should be defined by the appended claims.

The invention claimed is:

1. A CML to CMOS conversion circuit, comprising:
a first differential unit, a second differential unit, and an output unit, the first differential unit comprises a first differential transistor M1 and a second differential transistor M2, the second differential unit comprises a third differential transistor M3 and a fourth differential transistor M4, the output unit comprises a series connection of a first inverter and a second inverter, the gate of the first differential transistor M1 and the gate of the second differential transistor M2 receive an input voltage, the source or drain of the first differential transistor M1 is connected with the source or drain of the second differential transistor M2, the drain or source of the first differential transistor M1 is connected with the drain or source of the third differential transistor M3, the drain or source of the second differential transistor M2 is connected with the drain or source of the fourth differential transistor M4, the gate of the third differential transistor M3 is connected with the gate of the fourth differential transistor M4, the gate of the third differential transistor is connected with its drain or source, the input terminal of the first inverter is connected with the drain or source of the second differential transistor M2, the source or drain of the third differential transistor M3 and the source or drain of the fourth differential transistor M4 are connected with a supply voltage, wherein,
a resistor is connected with the first inverter in parallel.

2. The CML to CMOS conversion circuit according to claim 1, wherein, the first differential transistor M1 and the second differential transistor M2 are NMOS transistors; the third differential transistor M3 and the fourth differential transistor M4 are PMOS transistors.

3. The CML to CMOS conversion circuit according to claim 1, wherein, the value of the resistor is in a range from 10 KΩ~1 MΩ.

* * * * *